US011848280B2

(12) United States Patent
Huang et al.

(10) Patent No.: US 11,848,280 B2
(45) Date of Patent: Dec. 19, 2023

(54) METHOD FOR MANUFACTURING ASSEMBLY STRUCTURE BY USING FRAME STRUCTURE ON SUBSTRATE

(71) Applicant: Advanced Semiconductor Engineering, Inc., Kaohsiung (TW)

(72) Inventors: Wen Hung Huang, Kaohsiung (TW); Yu-Ju Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 363 days.

(21) Appl. No.: 17/105,277

(22) Filed: Nov. 25, 2020

(65) Prior Publication Data

US 2022/0165683 A1 May 26, 2022

(51) Int. Cl.
| | |
|---|---|
| *H01L 21/48* | (2006.01) |
| *H01L 21/52* | (2006.01) |
| *H01L 21/56* | (2006.01) |
| *H01L 23/31* | (2006.01) |
| *H01L 23/498* | (2006.01) |
| *H01L 23/00* | (2006.01) |

(52) U.S. Cl.
CPC ........ *H01L 23/562* (2013.01); *H01L 21/4846* (2013.01); *H01L 21/4857* (2013.01); *H01L 21/52* (2013.01); *H01L 21/568* (2013.01); *H01L 23/3121* (2013.01); *H01L 23/49822* (2013.01); *H01L 23/49827* (2013.01); *H01L 23/49833* (2013.01); *H01L 23/49894* (2013.01)

(58) Field of Classification Search
CPC ... H01L 21/4846; H01L 21/52; H01L 21/568; H01L 21/4857; H01L 23/562; H01L 23/3121; H01L 23/49827; H01L 23/49833; H01L 23/49894; H01L 23/49822
See application file for complete search history.

(56) References Cited

U.S. PATENT DOCUMENTS

| | | | | |
|---|---|---|---|---|
| 7,732,712 | B2* | 6/2010 | Yamano | H01L 23/5389 361/761 |
| 8,237,059 | B2* | 8/2012 | Kanemaru | H01L 25/0655 361/761 |
| 8,502,081 | B2 | 8/2013 | Kanemaru et al. | |
| 9,570,400 | B2* | 2/2017 | Baek | H01L 24/19 |
| 2006/0208356 | A1* | 9/2006 | Yamano | H01L 23/3128 257/E23.173 |
| 2015/0359119 | A1* | 12/2015 | Ota | H05K 1/141 361/752 |

FOREIGN PATENT DOCUMENTS

EP 2019572 A2 * 1/2009 ....... H01L 23/49838

* cited by examiner

*Primary Examiner* — Alonzo Chambliss
(74) *Attorney, Agent, or Firm* — FOLEY & LARDNER LLP

(57) ABSTRACT

An assembly structure and a method for manufacturing the same are provided. The method for manufacturing the assembly structure includes providing a substrate defining an active region and a side rail surrounding the active region; and forming a frame structure on the side rail.

19 Claims, 20 Drawing Sheets

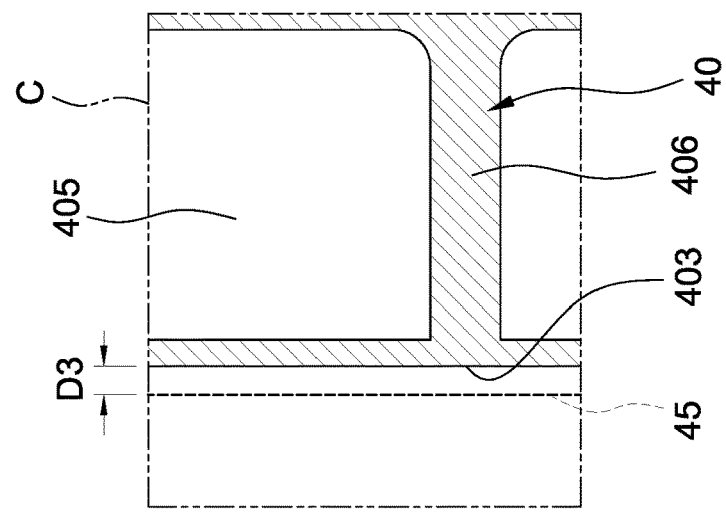
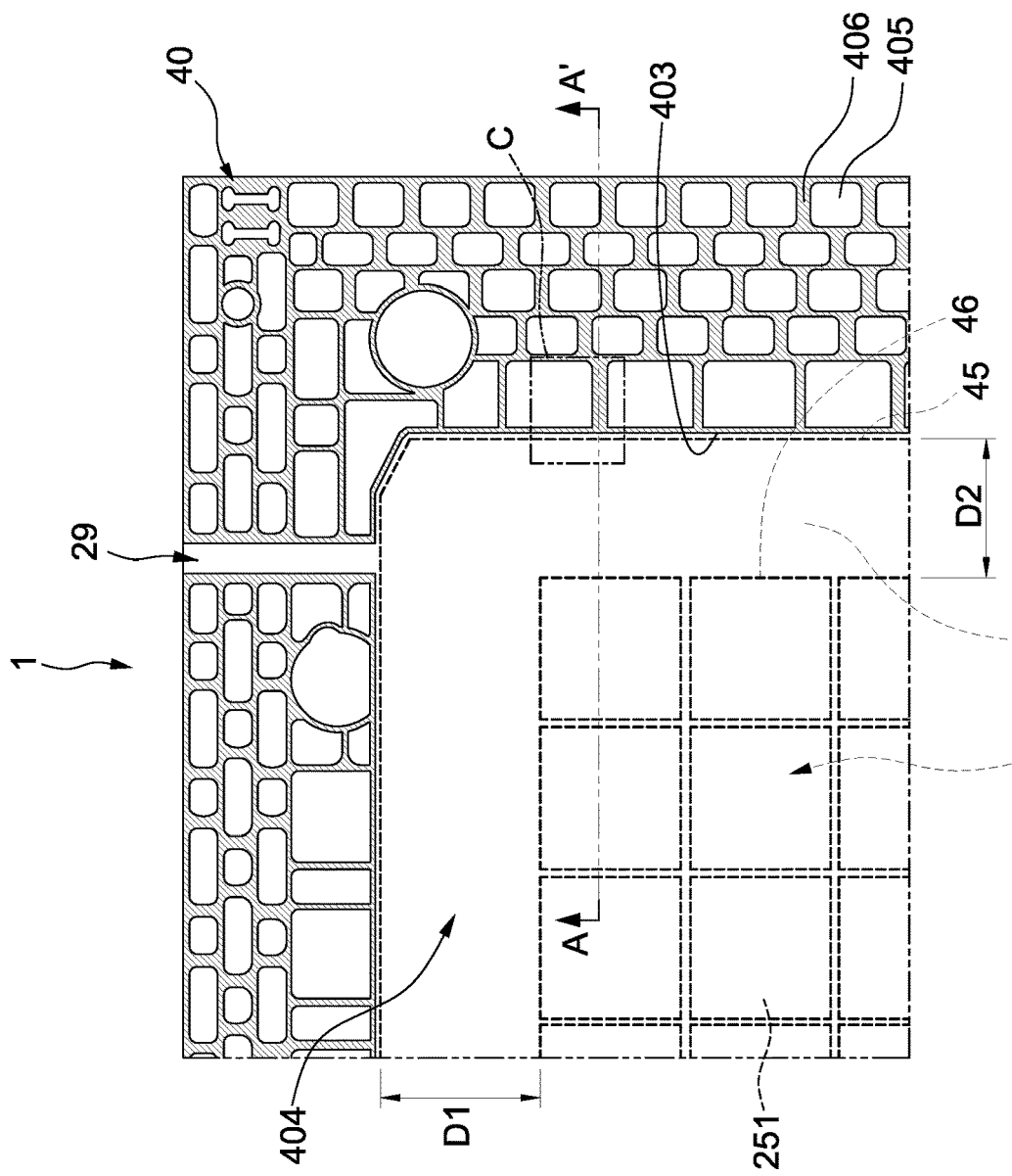
FIG. 2C
FIG. 2B

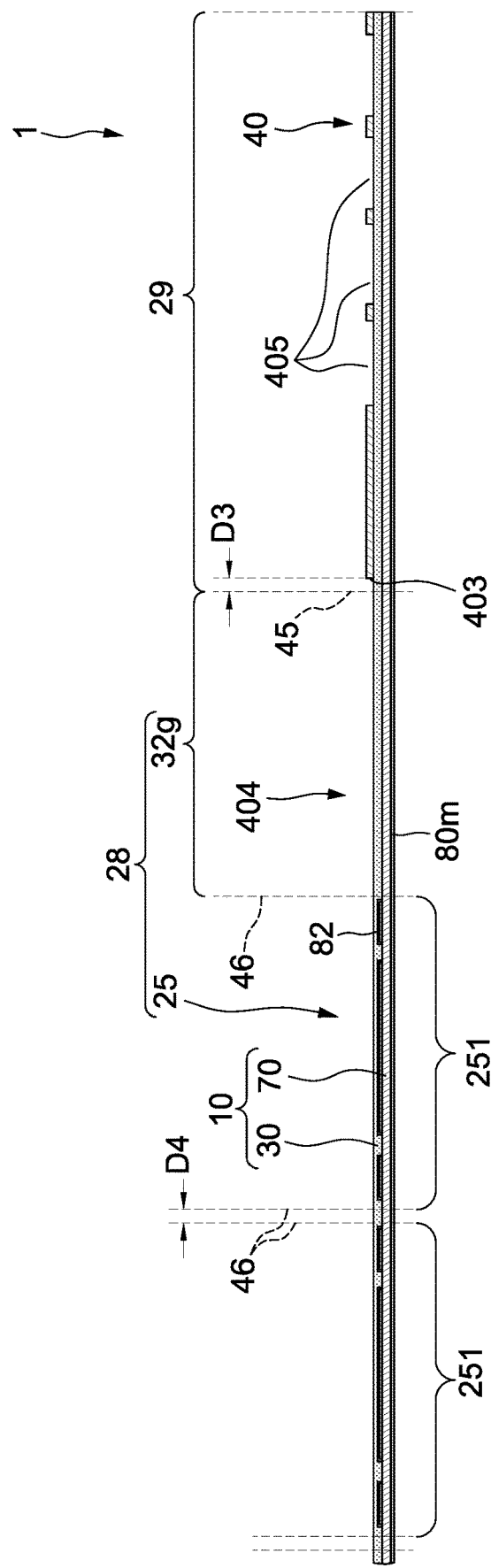

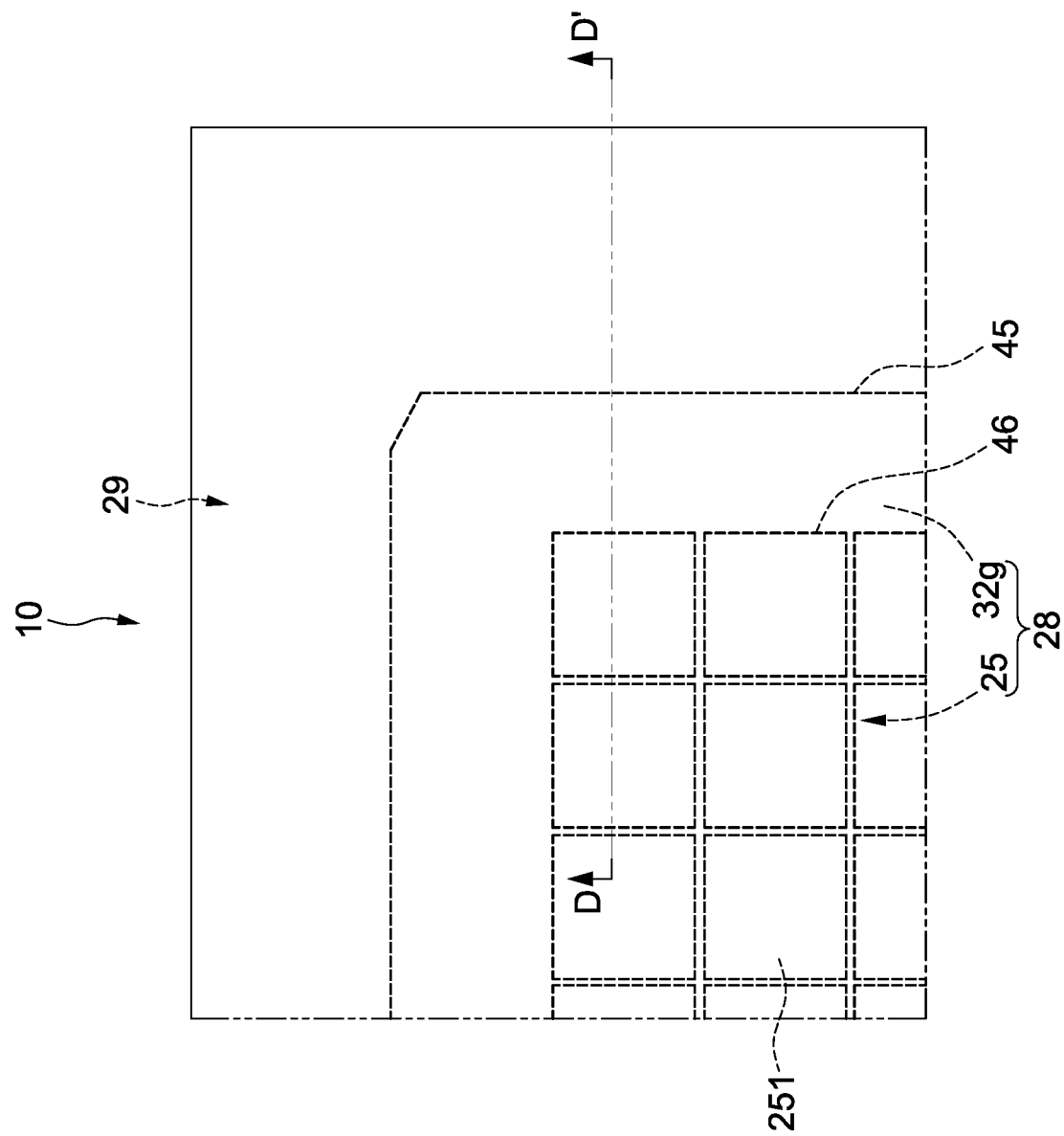

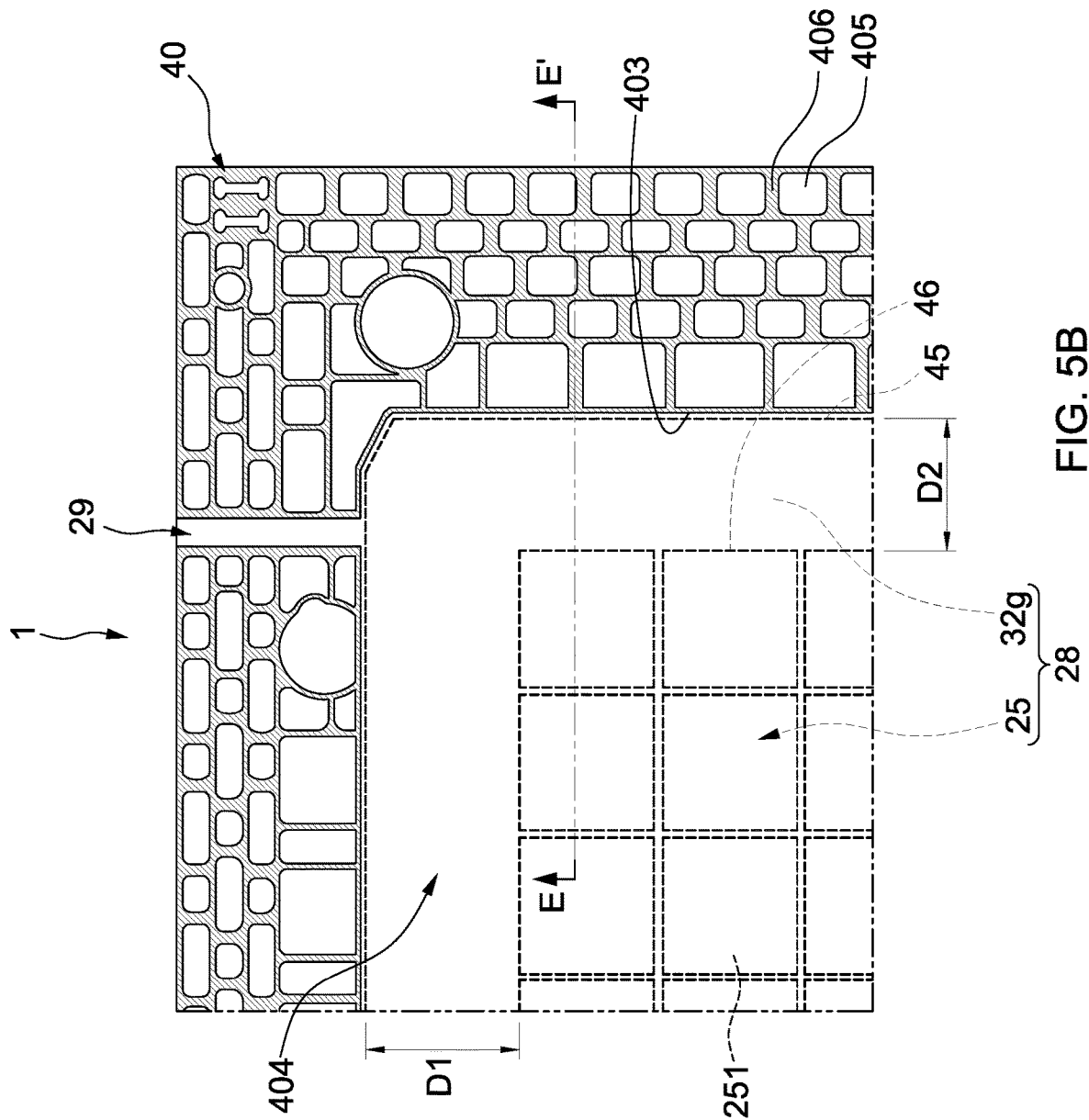

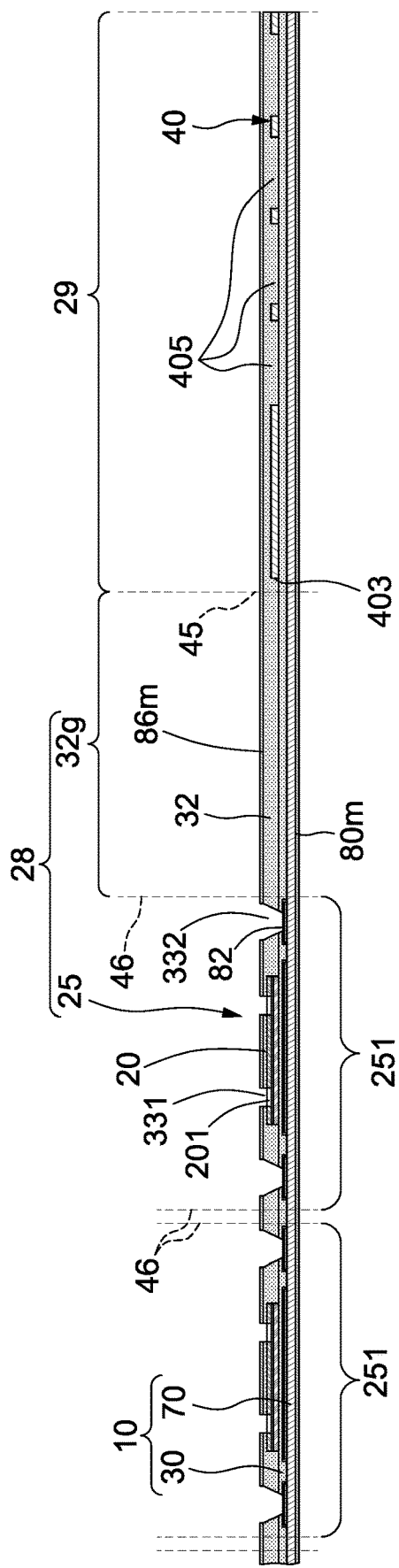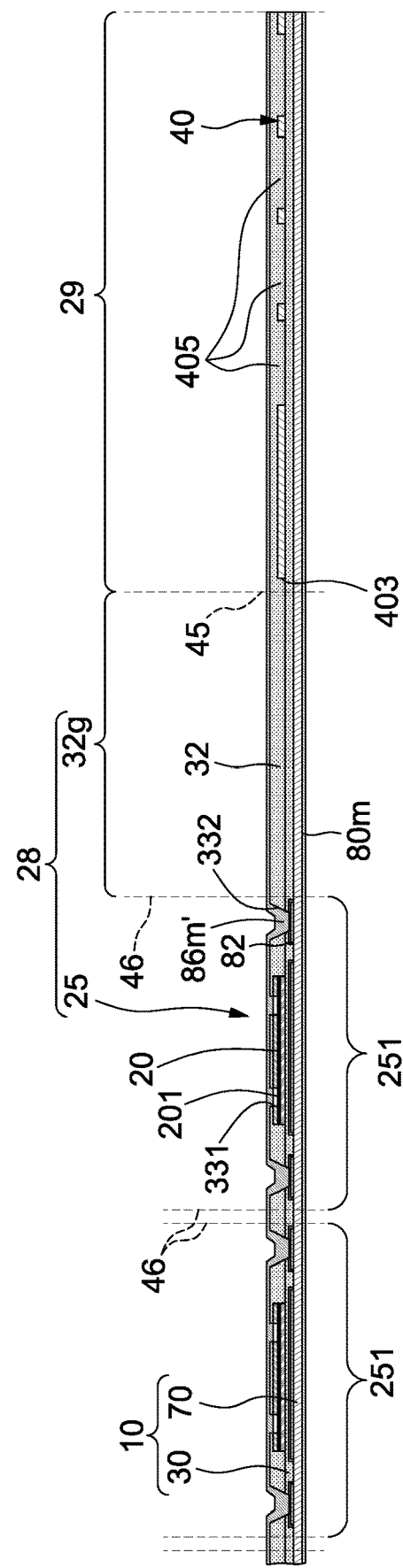

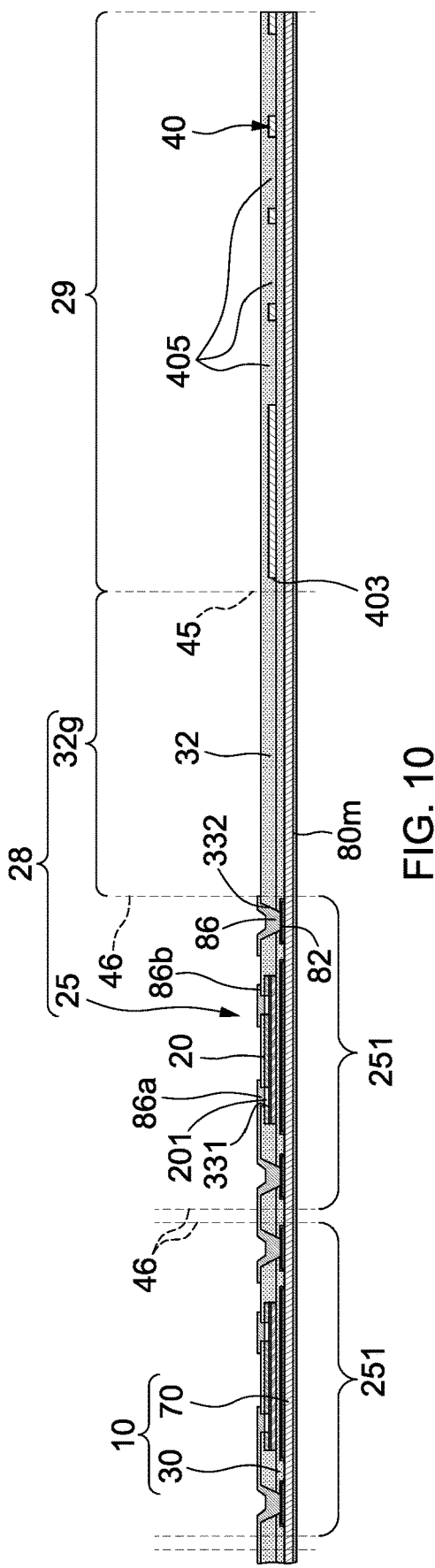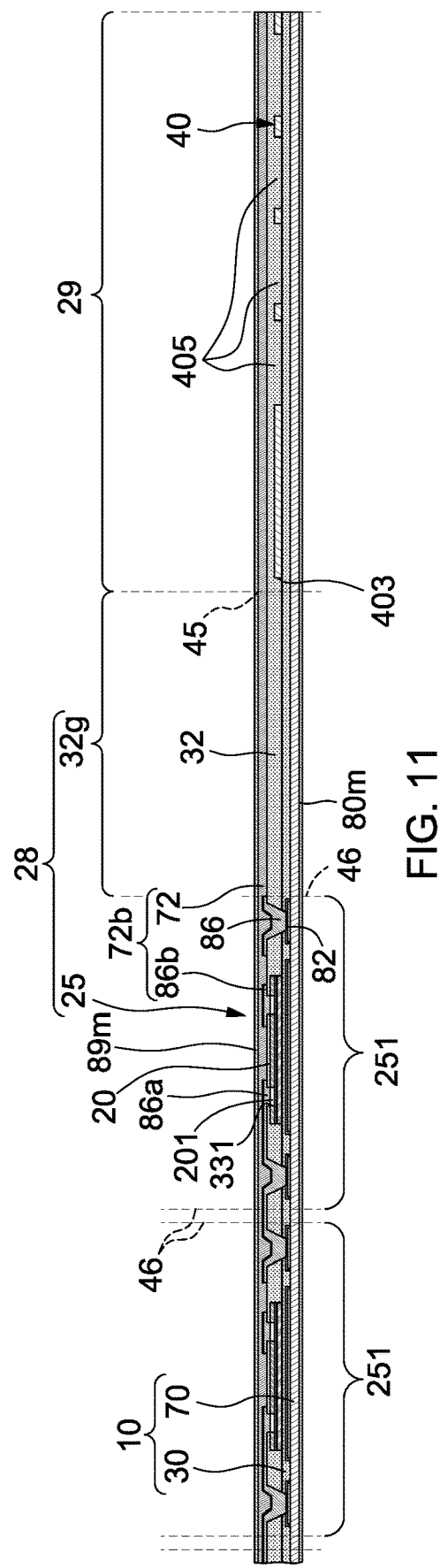

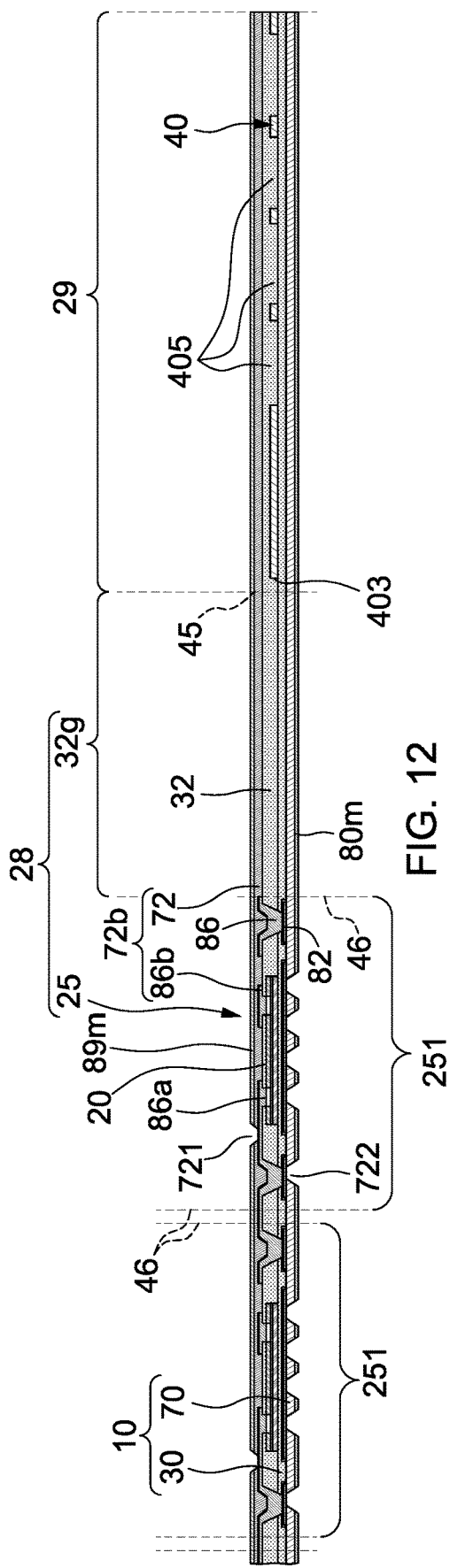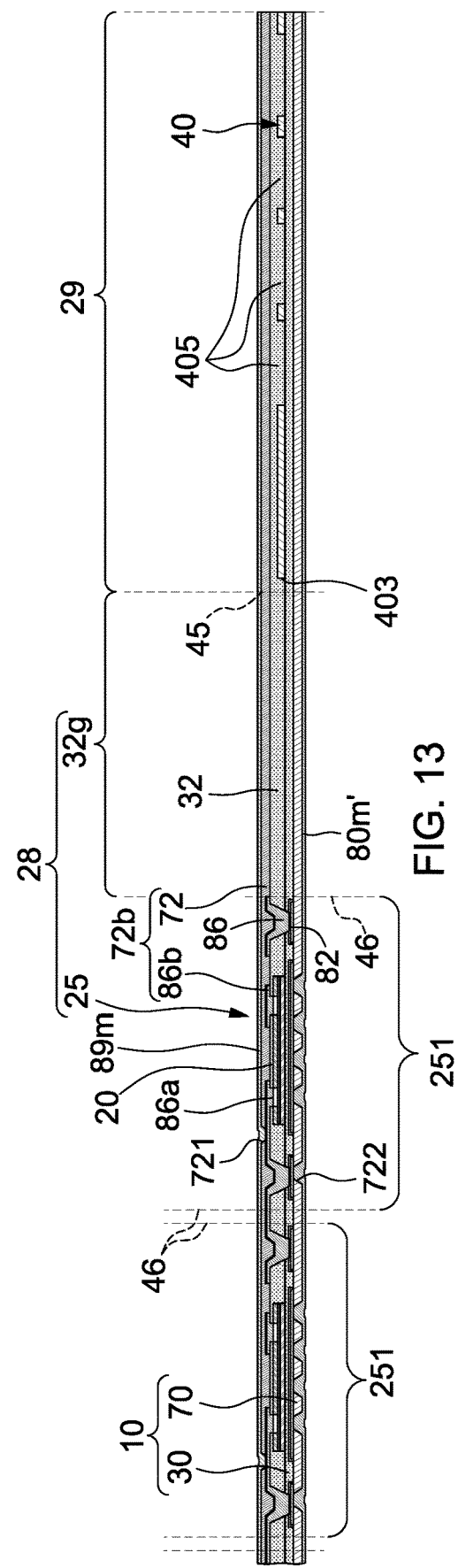

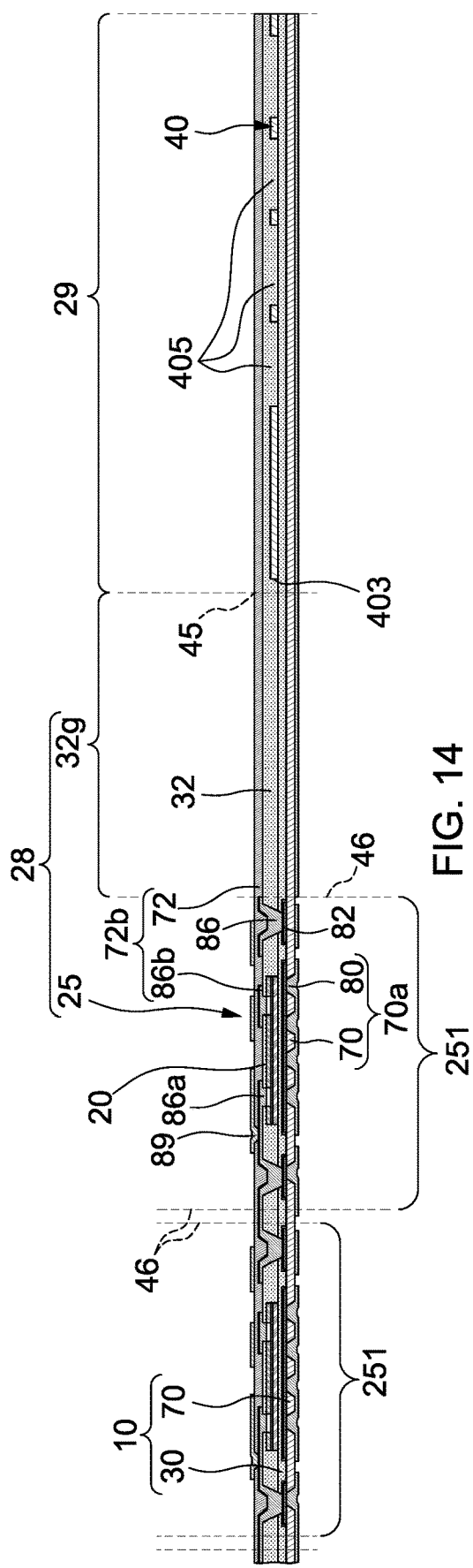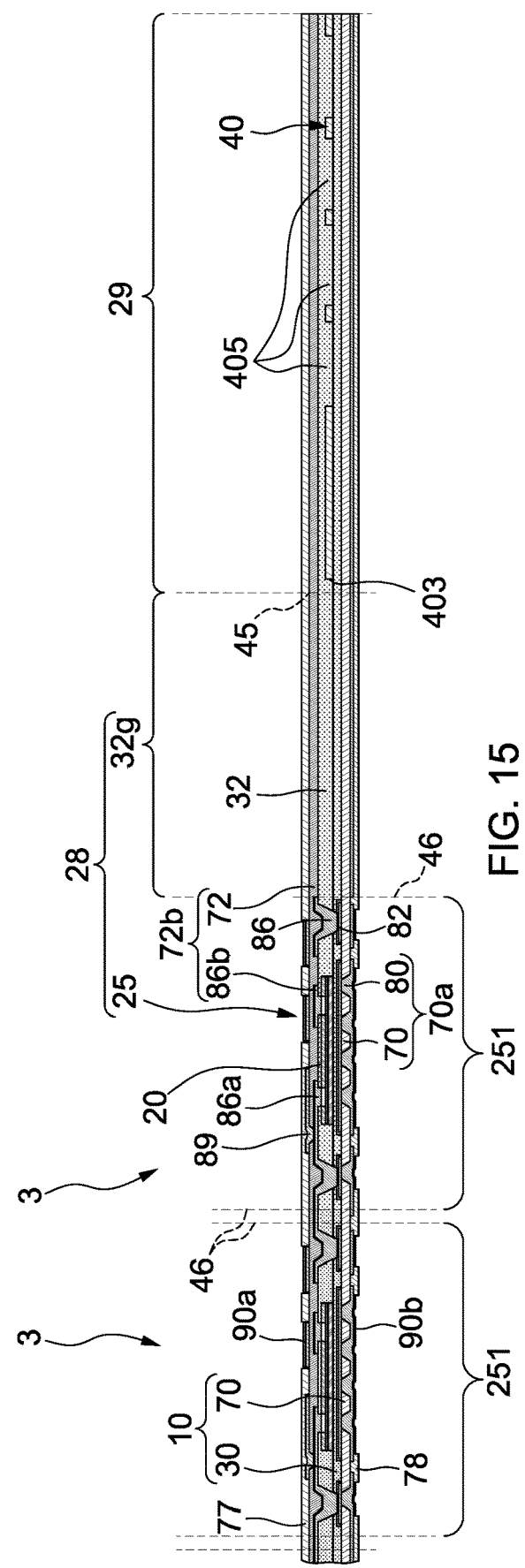

METHOD FOR MANUFACTURING ASSEMBLY STRUCTURE BY USING FRAME STRUCTURE ON SUBSTRATE

BACKGROUND

1. Field of the Disclosure

The present disclosure relates to an assembly structure and a method for manufacturing an assembly structure. Specifically, the present disclosure relates to a method for manufacturing an assembly structure by using a frame structure.

2. Description of the Related Art

During an operation for manufacturing a semiconductor package, the frame structure on a substrate after a sawing process may include burrs and warpage. The warpage of the substrate will be disadvantage to the following operations. Better operation for manufacturing a semiconductor package is needed.

SUMMARY

In some embodiments, a method for manufacturing an assembly structure includes: providing a substrate defining an active region and a side rail surrounding the active region; and forming a frame structure on the side rail.

In some embodiments, a semiconductor package includes a substrate, an electronic component, a first redistribution structure, a second redistribution structure and a first insulation layer and an interconnection. The substrate includes a carrier and a second insulation layer. The electronic component is disposed on the substrate. The first redistribution structure is under the electronic component. The second redistribution structure is above the electronic component. The first insulation layer is disposed between the first redistribution structure and the second redistribution structure and encapsulating the electronic component. The interconnection surrounds the electronic component and extends through the second insulation layer and the first insulation layer.

In some embodiments, a method for manufacturing an assembly structure includes: providing a substrate; forming a frame structure on the substrate; and removing the frame structure by separating the substrate with a predetermined distance from an inner edge of the frame structure.

BRIEF DESCRIPTION OF THE DRAWINGS

Aspects of some embodiments of the present disclosure are readily understood from the following detailed description when read in conjunction with the accompanying figures. It is noted that various structures may not be drawn to scale, and dimensions of the various structures may be arbitrarily increased or reduced for clarity of discussion.

FIG. 2B illustrates a partially enlarged view of the assembly structure of FIG. 2A according to some embodiments of the present disclosure.

FIG. 2C illustrates an enlarged view of a region "C" in FIG. 2B according to some embodiments of the present disclosure.

FIG. 2D illustrates a cross-sectional view taken along line A-A' in FIG. 2B.

FIG. 4B illustrates one or more stages of an example of a method for manufacturing an assembly structure according to some embodiments of the present disclosure.

FIG. 5B illustrates one or more stages of an example of a method for manufacturing an assembly structure according to some embodiments of the present disclosure.

FIG. 8 illustrates one or more stages of an example of a method for manufacturing an assembly structure according to some embodiments of the present disclosure.

FIG. 9 illustrates one or more stages of an example of a method for manufacturing an assembly structure according to some embodiments of the present disclosure.

FIG. 10 illustrates one or more stages of an example of a method for manufacturing an assembly structure according to some embodiments of the present disclosure.

FIG. 11 illustrates one or more stages of an example of a method for manufacturing an assembly structure according to some embodiments of the present disclosure.

FIG. 12 illustrates one or more stages of an example of a method for manufacturing an assembly structure according to some embodiments of the present disclosure.

FIG. 13 illustrates one or more stages of an example of a method for manufacturing an assembly structure according to some embodiments of the present disclosure.

FIG. 14 illustrates one or more stages of an example of a method for manufacturing an assembly structure according to some embodiments of the present disclosure.

FIG. 15 illustrates one or more stages of an example of a method for manufacturing an assembly structure according to some embodiments of the present disclosure.

DETAILED DESCRIPTION

Figure 1:
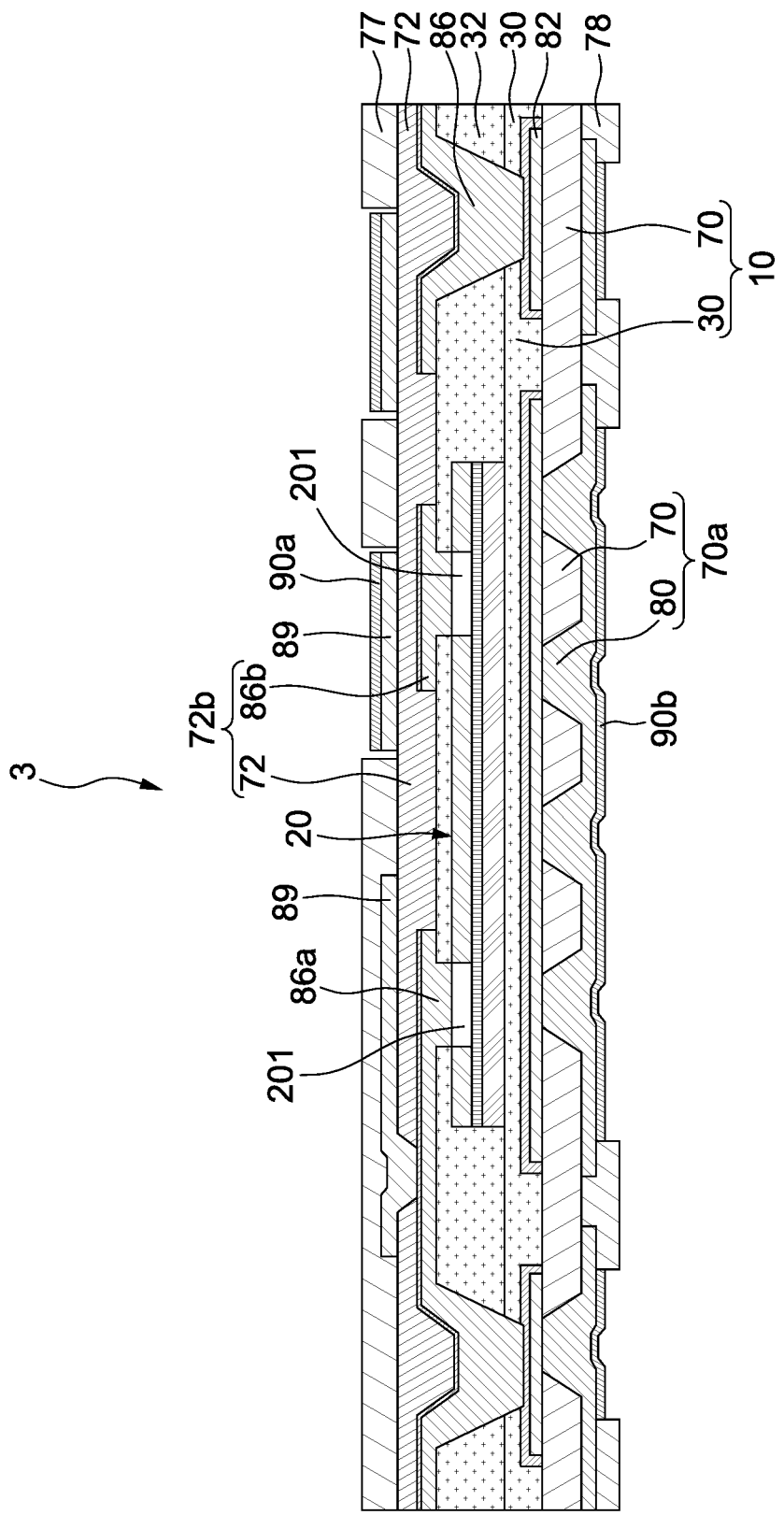
FIG. 1 illustrates a cross-sectional view of a semiconductor package unit according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a new assembly structure, and a new method for manufacturing an assembly structure.

FIG. 1 illustrates a cross-sectional view of a semiconductor package unit 3 according to some embodiments of the present disclosure. The semiconductor package unit 3 may include a substrate 10, an electronic component 20, a first redistribution structure 70a, a second redistribution structure 72b, a third redistribution structure 86a, a first insulation layer 32, a first protection layer 78, a second protection layer 77, an interconnection 86 and an outer circuit layer 89. In some embodiments, an additional electronic component (e.g., an active component or passive component) may be further electrically connected to the outer circuit layer 89, and an encapsulant may be further disposed to cover the additional electronic component and second protection layer 77 so as to form a semiconductor package structure.

The substrate 10 includes a carrier 70 and a second insulation layer 30. The carrier 70 may include a first dielectric layer. The carrier 70 may include a polymer (e.g., polypropylene (PP)) or another suitable material to support components thereon. In some embodiment, the carrier 70 may include fillers or fibers. The second insulation layer 30 may include a resin (e.g., Ajinomoto Build-up Film (ABF)) or another suitable material to support components thereon. In some embodiment, the second insulation layer 30 may not include fillers or fibers. That is, the second insulation layer 30 may be resin only. The electronic component 20 is disposed on the substrate 10. The electronic component 20 may be an active component such as a semiconductor die or a passive component, and may include at least one conductive pad 201 disposed adjacent to an active surface (e.g., a top surface) thereof. A backside surface (e.g., a bottom surface) of the electronic component 20 may be disposed on or contact a top surface of the substrate 10 (i.e., a top surface of the second insulation layer 30). In some embodiments, the substrate 10 may further include an intermediate conductive layer 82 interposed between the carrier 70 and the second insulation layer 30. For example, the intermediate conductive layer 82 may be disposed on a top surface of the carrier 70, and the second insulation layer 30 may cover the intermediate conductive layer 82 and the top surface of the carrier 70.

The first redistribution structure 70a is disposed under the electronic component 20. The first redistribution structure 70a includes the carrier 70 and a first conductive layer 80. In some embodiments, the first conductive layer 80 may include, for example, gold (Au), silver (Ag), copper (Cu), other metal(s) or alloy(s), or other suitable conductive material. The first conductive layer 80 may be a fan-out circuit layer or a redistribution layer (RDL). The first conductive layer 80 may be disposed on a bottom surface of the carrier 70. Portions (e.g., via portions) of the first conductive layer 80 may extend through the carrier 70 to contact the intermediate conductive layer 82. The via portions of the first conductive layer 80 may taper upward. The second insulation layer 30 is disposed between the first redistribution structure 70a and the electronic component 20.

The second redistribution structure 72b is disposed above the electronic component 20. The second redistribution structure 72b includes a second dielectric layer 72 and second conductive layer 86b. The second conductive layer 86b is embedded in the second dielectric layer 72. In some embodiments, the second conductive layer 86b may include, for example, Au, Ag, Cu, other metal(s) or alloy(s), or other suitable conductive material. The second conductive layer 86b may be a fan-out circuit layer or a redistribution layer (RDL), and may be disposed on the top surface of the first insulation layer 32. The second conductive layer 86b may connect the third redistribution structure 86a. The second dielectric layer 72 may include a PP or another suitable material. In some embodiment, the second dielectric layer 72 may include fillers or fibers. The first insulation layer 32 is disposed between the first redistribution structure 70a and the second redistribution structure 72b. The first insulation layer 32 encapsulates the electronic component 20. In some embodiment, the first insulation layer 32 may not include fillers or fibers. That is, the first insulation layer 32 may be resin only. The first insulation layer 32 may include a resin (e.g., Ajinomoto Build-up Film (ABF)) or another suitable material. A material of the second insulation layer 30 may be the same as or different from a material of the first insulation layer 32. A filler size of the first insulation layer 30 and the second insulation layer 32 is less than a filler size of the carrier 70 (i.e., the first dielectric layer of the first redistribution structure 70a) and the second dielectric layer 72 of the second redistribution structure 70b. The third redistribution structure 86a is used for electrically connecting the conductive pad 201 of the electronic component 20 and the second conductive layer 86b of the second redistribution structure 72b. In some embodiments, the third redistribution structure 86a may include, for example, Au, Ag, Cu, other metal(s) or alloy(s), or other suitable conductive material. The third redistribution structure 86a may be embedded in the second insulation layer 32. The third redistribution structure 86a and the second conductive layer 86b may be formed concurrently and integrally.

The interconnection (e.g. conductive via) 86 surrounds the electronic component 20. The interconnection 86 extends through the second insulation layer 30 and the first insulation layer 32, and tapers downward. The interconnection 86 electrically connects and physically connects the second conductive layer 86b and the intermediate conductive layer 82. Thus, the interconnection 86 electrically connects the first redistribution structure 70a and the second redistribution structure 72b. In some embodiments, the interconnection 86 may include, for example, Au, Ag, Cu, other metal(s) or alloy(s), or other suitable conductive material. The interconnection 86 and the second conductive layer 86b may be formed concurrently and integrally.

The outer circuit layer 89 is disposed on the second dielectric layer 72 of the second redistribution structure 70b. A portion of the outer circuit layer 89 extends through the second dielectric layer 72 to contact the second conductive layer 86b. In some embodiment, the first protection layer 78 and the second protection layer 77 may be solder mask layers. The second protection layer 77 is disposed on the second redistribution structure 72b to cover the outer circuit layer 89. The second protection layer 77 may define at least one opening to expose at least one portion of the outer circuit layer 89. A surface finish layer 90a may be disposed on the exposed portion of the outer circuit layer 89. In addition, the first protection layer 78 is disposed on the first redistribution structure 70a to cover the first conductive layer 80. The first protection layer 78 may define at least one opening to expose at least one portion of the first conductive layer 80. A surface finish layer 90b may be disposed on the exposed portion of the first conductive layer 80.

Figure 2A:
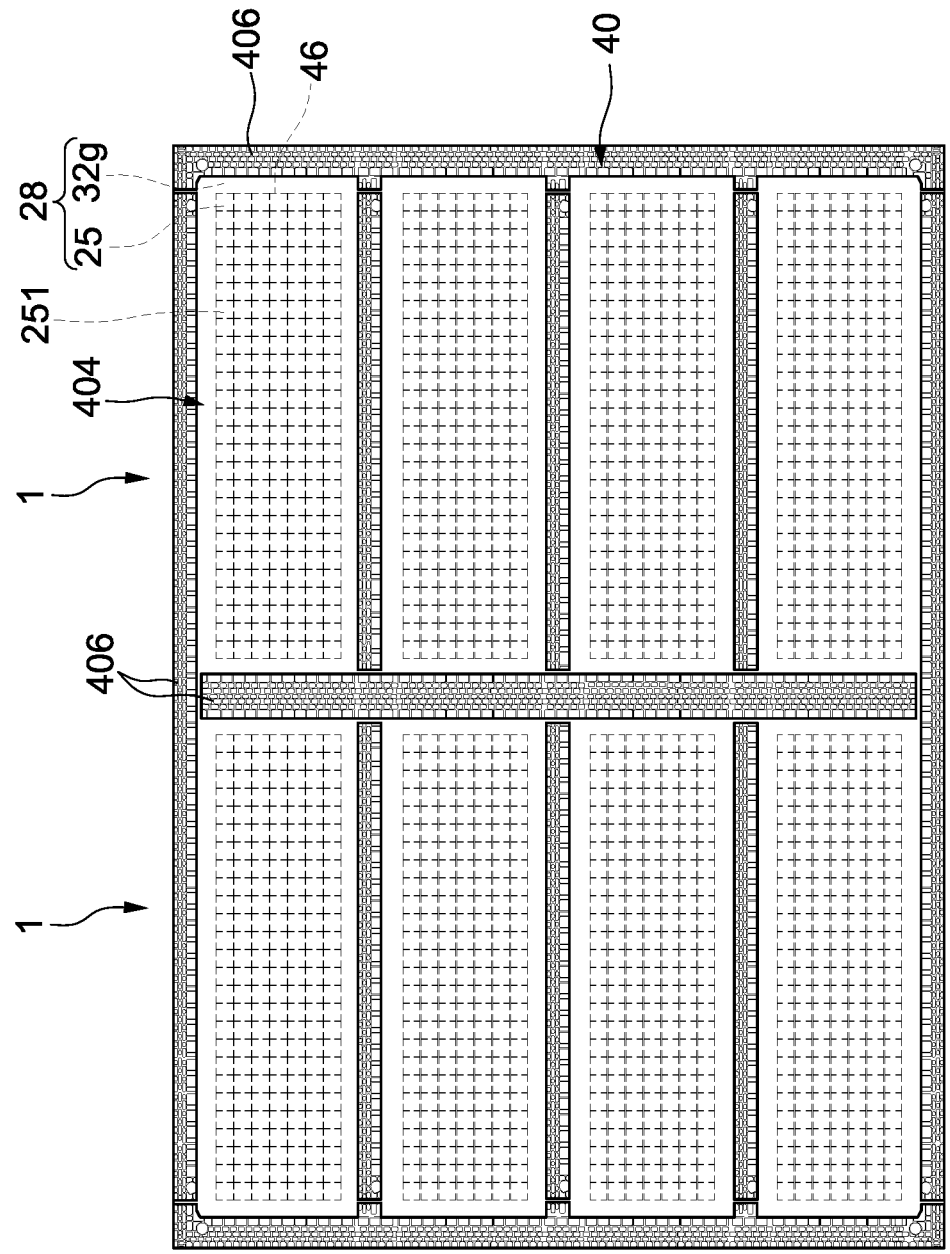
FIG. 2A illustrates a top view of at least one assembly structure according to some embodiments of the present disclosure.

FIG. 2A illustrates a top view of at least one assembly structure 1 according to some embodiments of the present disclosure. FIG. 2B illustrates a partially enlarged view of the assembly structure 1 of FIG. 2A according to some embodiments of the present disclosure. FIG. 2C illustrates an enlarged view of a region "C" in FIG. 2B according to some embodiments of the present disclosure. FIG. 2D illustrates a cross-sectional view taken along line A-A' in FIG. 2B. The assembly structure 1 may be a strip structure, and may be in a rectangular shape from a top view (FIG. 2A). The assembly structure 1 includes a substrate 10 and a frame structure 40 on a top surface of the substrate 10. The substrate 10 may be similar to the substrate 10 of FIG. 1, and may include the carrier 70, the second insulation layer 30 and the intermediate conductive layer 82. In some embodiments, the substrate 10 may further include a conductive material 80m (e.g., a metal layer such as a copper layer) on the bottom surface of carrier 70. The substrate 10 includes at least one active region 28 and a side rail 29. The active region 28 is an effective area that a plurality of semiconductor elements or semiconductor devices are disposed on. The side rail 29 surrounds the active region 28, and is covered by the frame structure 40. The side rail 29 may be outside the active region 28. After a sawing process, the side rail 29 and the frame structure 40 are removed and discarded. The frame structure 40 is disposed on the side rail 29. In some embodiments, the frame structure 40 is disposed only on the side rail 29. That is, the frame structure 40 does not extend into the active region 28. In some embodiments, the active region 28 and the side rail 29 are defined by at least one predetermined separation line 45. The predetermined separation line 45 may be also referred to as "outer sawing line", "outer sawing street", "outer cutting line", "outer cutting street". During a sawing process, a cutting tool (e.g., a sawing blade or laser) may move along the predetermined separation line 45.

The side rail 29 may be extended outside the predetermined separation line 45. A predetermined distance D3 between the at least one predetermined separation line 45 and an inner edge (or inner side surface) 403 of the frame structure 40 is greater than 0.1 millimeter (mm). Thus, the frame structure 40 will not be sawed during a sawing operation, and no burr will remained. The substrate 10 further defines a chip attach area 25 within the active region 28. The chip attach area 25 may include a plurality of unit areas 251 arranged in an array. A distance D4 between each of the unit areas 251 is 0.1 mm, 0.25 mm or 0.3 mm. The distance D4 may be used to avoid the die crack, manufacturing tolerance or yield loss during a singulation process. Each of the unit areas 251 may be used for an electronic component 20 (FIG. 1) or the additional electronic component (e.g., an active component or passive component) to be disposed on. The chip attach area 25 and the unit areas 251 are defined by a plurality of inner sawing line 46. The inner sawing line 46 may be also referred to as "predetermined separation line", "inner sawing street", "inner cutting line", "inner cutting street". During a sawing process, a cutting tool (e.g., a sawing blade or laser) may move along the inner sawing line 46.

As shown in FIG. 2B, a predetermined gap 32g (distance D1 or distance D2) between a periphery edge of the chip attach area 25 (e.g., the outermost inner sawing line 46) and a periphery edge of the active region 28 is greater than 2 mm and less than 9 mm. The predetermined gap 32g may be used to avoid the die crack, manufacturing tolerance or yield loss during a sawing process. The inner edge (or inner side surface) 403 of the frame structure 40 substantially defines an window 404 corresponding to the active region 28. A size of the active region 28 is slightly less than a size of the window 404 of the frame structure 40. Thus, the window 404 of the frame structure 40 substantially exposes the entire active region 28. The area exposed from the window 404 is a work area (e.g., for forming the first insulation layer 32) in a subsequent process. The size of the window 404 may control the thickness of the first insulation layer 32. The inner edge (or inner side surface) 403 of the frame structure 40 may block the flowing of the first insulation layer 32 so to avoid the first insulation layer 32 directly flowing out the entire active region 28. Further, the frame structure 40 may define a plurality of through holes 405 extending through the frame structure 40 so as to adjust the metal residual ratio (e.g., copper residual ratio) of the assembly structure 1. The first insulation layer 32 may fill into the through holes 405 so that the sizes of the through holes 405 may be used to control the thickness of the first insulation layer 32.

In some embodiment, the frame structure 40 may include a plurality of separated segments 406 disposed on the side rail 29. That is, the frame structure 40 is formed by the individual segments 406. The frame structure 40 may be not an integral or one-piece structure. However, in some embodiments, the frame structure 40 may be an integral or one-piece structure. The segments 406 are spaced apart from each other, and there may be a gap between two segments 406. A material of the frame structure 40 (i.e., the separated segments 406) may include stainless steel. The frame structure 40 has the advantage to control the height of the first insulation layer 32. If the frame structure 40 is sawed and a portion of the frame structure 40 is remained on the substrate 10 after a sawing operation, the remaining portion of the frame structure 40 may cause the substrate 10 to have a warpage and burr. The problem of the warpage and burr of the active region 28 after the sawing operation can be solved by removing all of the frame structure 40 and retaining the gap 32g between the periphery edge of the chip attach area 25 and the periphery edge of the active region 28. In some embodiments, the active region 28 includes a geometrically asymmetry shape from a top view after removing the frame structure 40.

Figure 2E:
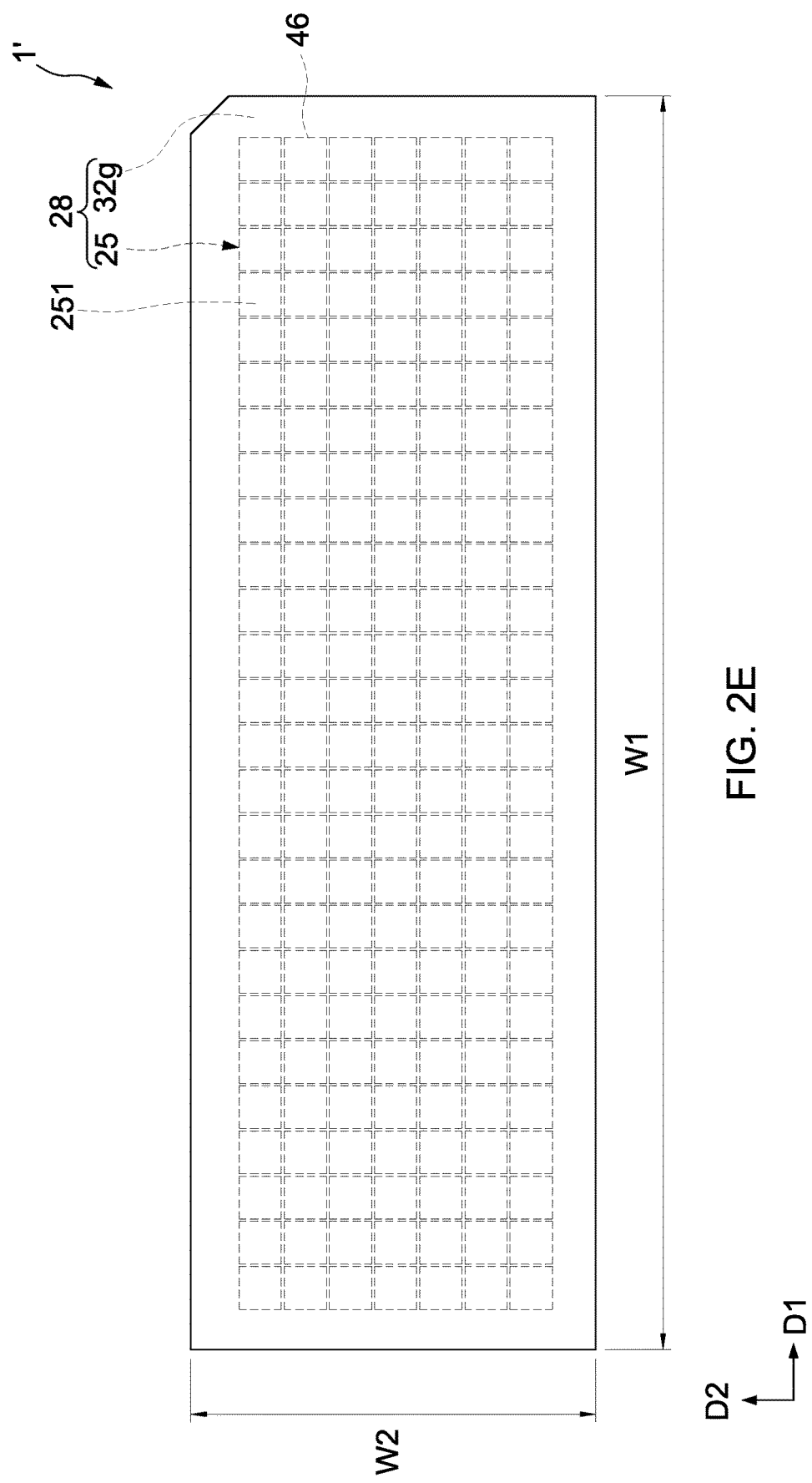
FIG. 2E illustrates a top view of an assembly structure according to some embodiments of the present disclosure.

FIG. 2E illustrates a top view of an assembly structure 1' according to some embodiments of the present disclosure.

Figure 2F:
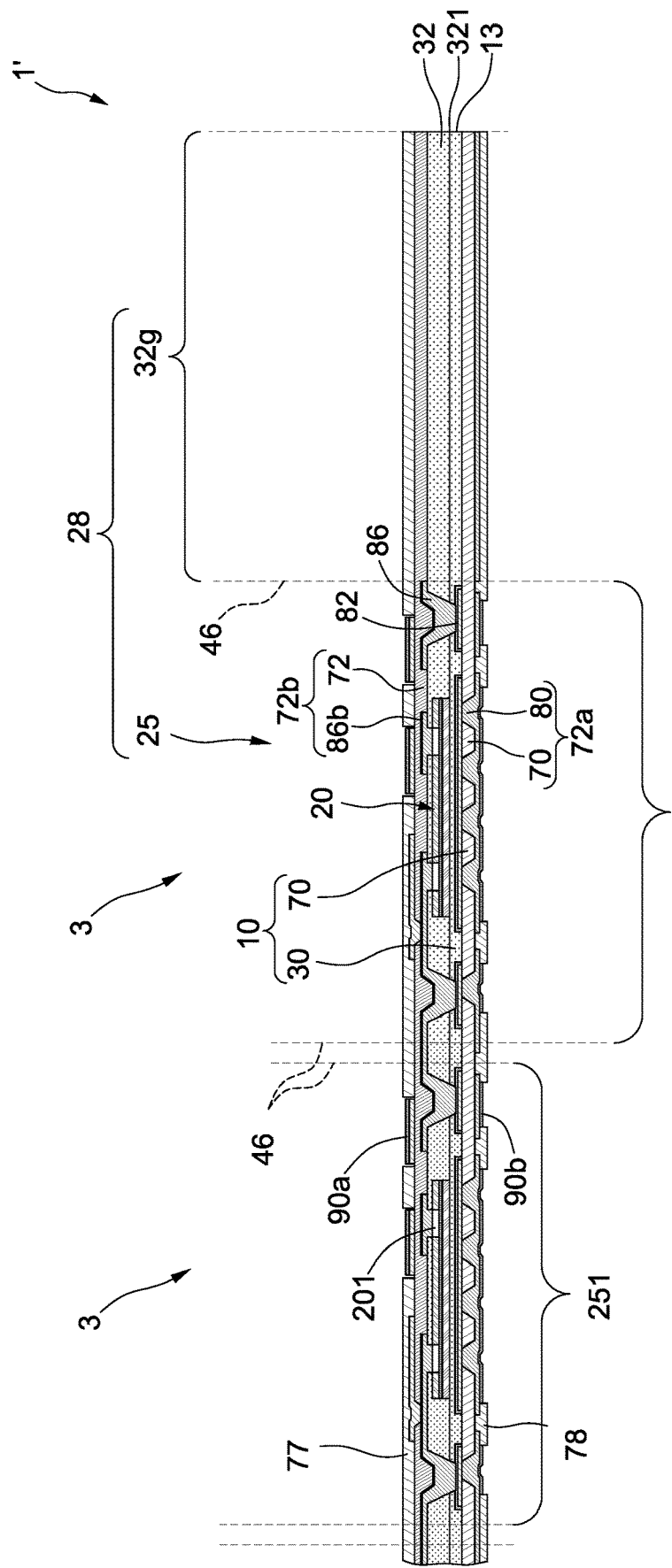
FIG. 2F illustrates an enlarged cross-sectional view of the assembly structure in FIG. 2E.

FIG. 2F illustrates an enlarged cross-sectional view of the assembly structure 1' in FIG. 2E. A plurality of semiconductor package units 3 of FIG. 1 are formed on the assembly structure 1 of FIGS. 2A to 2D, and the frame structure 40 is removed along the predetermined separation line 45 as to form the assembly structure 1' of FIGS. 2E and 2F. Thus, the assembly structure 1' may be a strip structure or a package substrate or an embedded substrate or a package device. The assembly structure 1' may include the active region 28 that includes the chip attach area 25 and the gap 32g. The chip attach area 25 may include a plurality of unit areas 251. Each of the semiconductor package units 3 is disposed in each of the unit areas 251. As shown in FIG. 2E, the assembly structure 1' has the geometrically asymmetry shape that a first width W1 along a first direction D1 and a second width W2 along a second direction D2 substantially perpendicular to the first direction D1. The first width W1 is greater than the second width W2. For example, the shape of the assembly structure 1' may be a rectangle, parallelogram or ellipse. In addition, as shown in FIG. 2F, an interface 321 between the second insulation layer 30 and the first insulation layer 32 is extended to a periphery side surface 13 of the assembly structure 1'. That is, the interface 321 is exposed from the periphery side surface 13 of the assembly structure 1'.

Figure 2G:
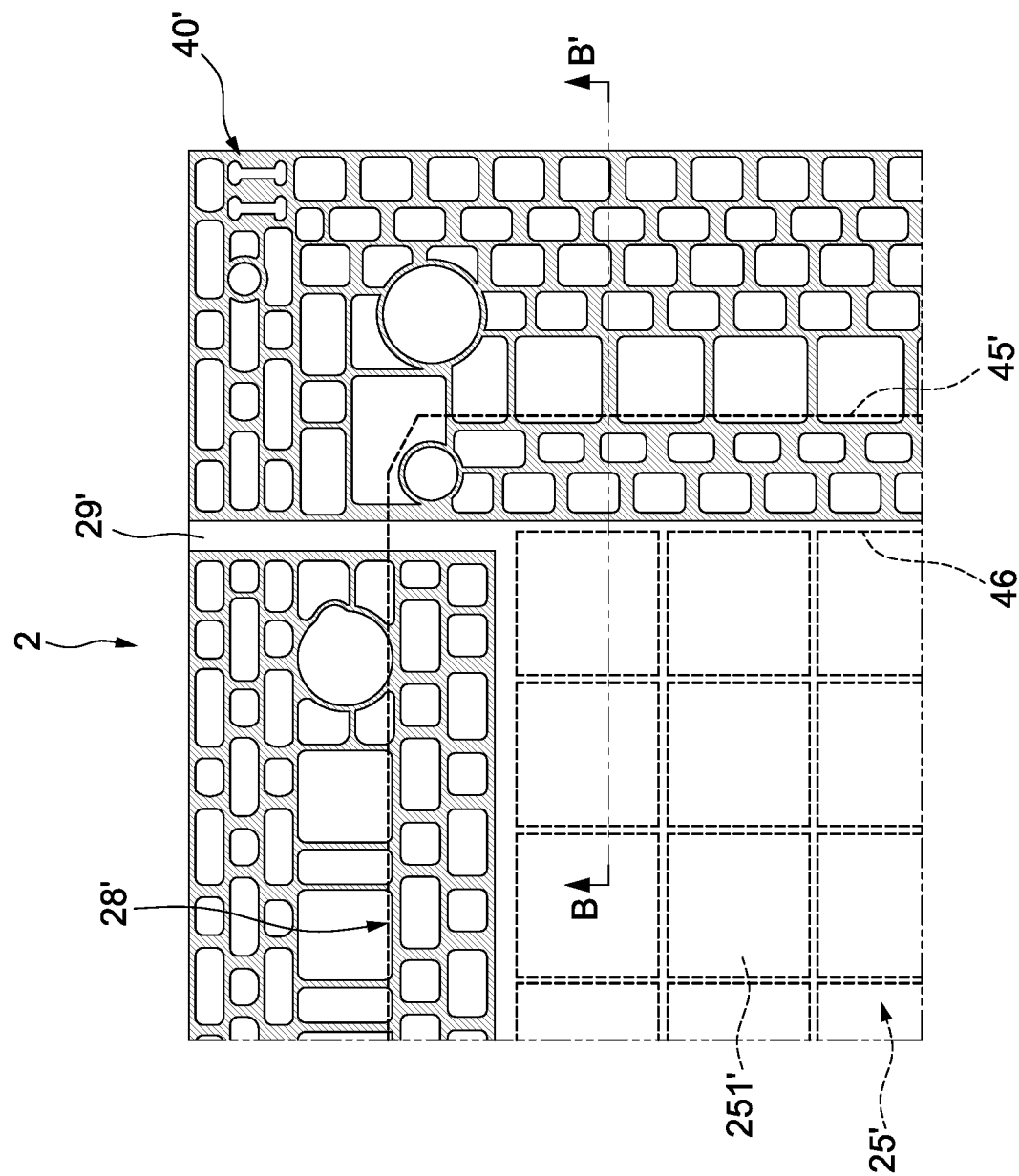
FIG. 2G illustrates a top view of a partially enlarged view of an assembly structure according to a comparison embodiment of the present disclosure.
Figure 2H:
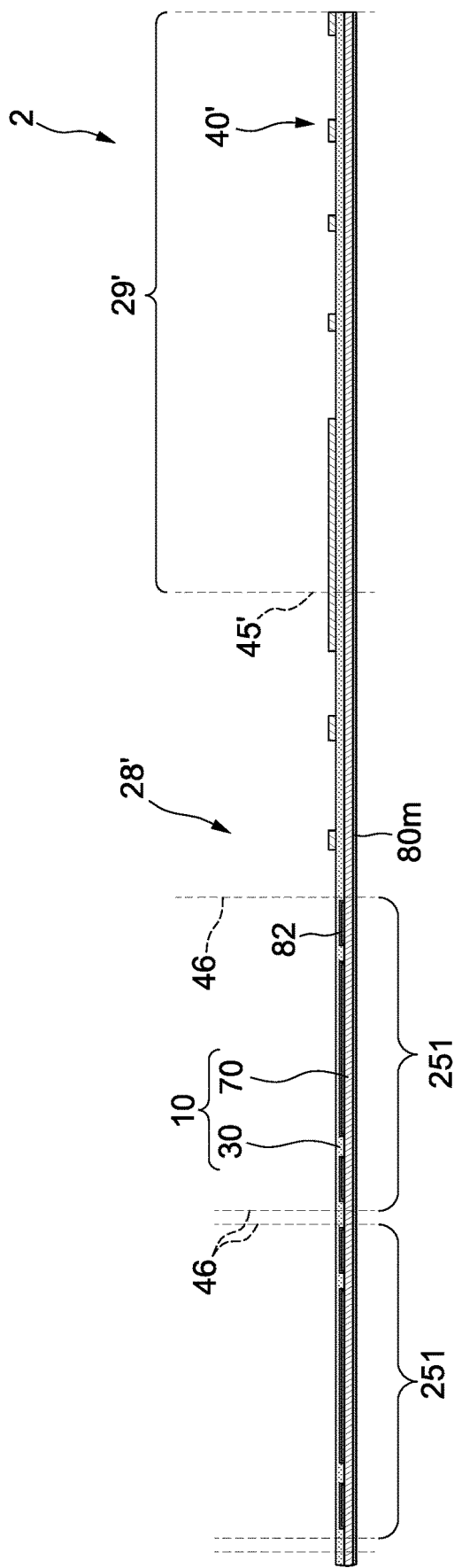
FIG. 2H illustrates a cross-sectional view taken along line B-B' in FIG. 2G.

FIG. 2G illustrates a top view of a partially enlarged view of an assembly structure 2 according to a comparison embodiment of the present disclosure. FIG. 2H illustrates a cross-sectional view taken along line B-B' in FIG. 2G. The assembly structure 2 includes a substrate 10' and frame structure 40' on the substrate 10'. From a top view, the substrate 10' includes an active region 28' and a side rail 29' covered by the frame structure 40'. The assembly structure 2 does not include a gap 32g (FIG. 2B). The chip attach area 25' is disposed in the active region 28' and is adjacent to the frame structure 40'. The predetermined separation line 45' defines the active region 28' and the side rail 29'. The frame structure 40' extends into the active region 28'. That is, the predetermined separation line 45' is disposed within the frame structure 40'. Thus, the active region 28' may include the chip attach area 25' and a portion of the frame structure 40'. A portion of the frame structure 40' may be sawed and removed along the predetermined separation line 45'. After the sawing operation, the remaining portion of the frame structure 40' may cause the substrate 10' to have warpage and burr. If the substrate 10' has the first width W1 greater than the second width W2 as shown in FIG. 2E, the warpage of the substrate 10' will be more severe. The warpage and burr of the substrate 10' will be disadvantage to the following operations.

FIG. 3 through FIG. 16 illustrate a method for manufacturing an assembly structure according to some embodiments of the present disclosure. In some embodiments, the method is for manufacturing the assembly structure 1' shown in FIGS. 2E to 2F.

Figure 3:
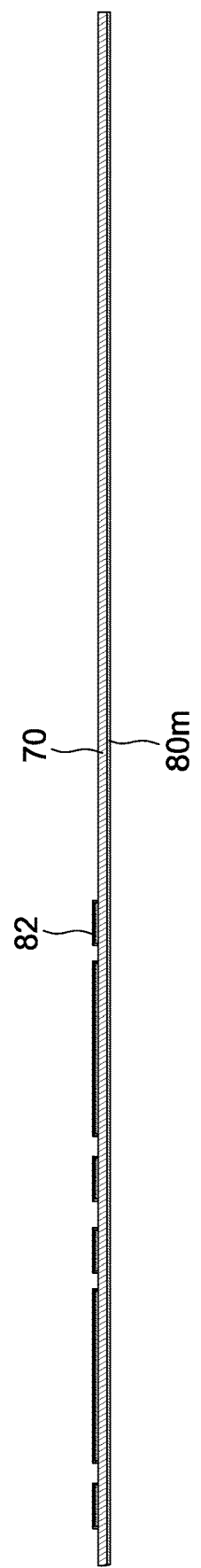
FIG. 3 illustrates one or more stages of an example of a method for manufacturing an assembly structure according to some embodiments of the present disclosure.

Referring to FIG. 3 through FIGS. 4A, 4B and 4C, a substrate 10 is provided as follows. Referring to FIG. 3, a carrier 70 is provided. An intermediate conductive layer 82 is formed or disposed on the top surface of the carrier 70 through patterning. A conductive material 80m is formed or disposed on the bottom surface of the carrier 70.

Figure 4A:
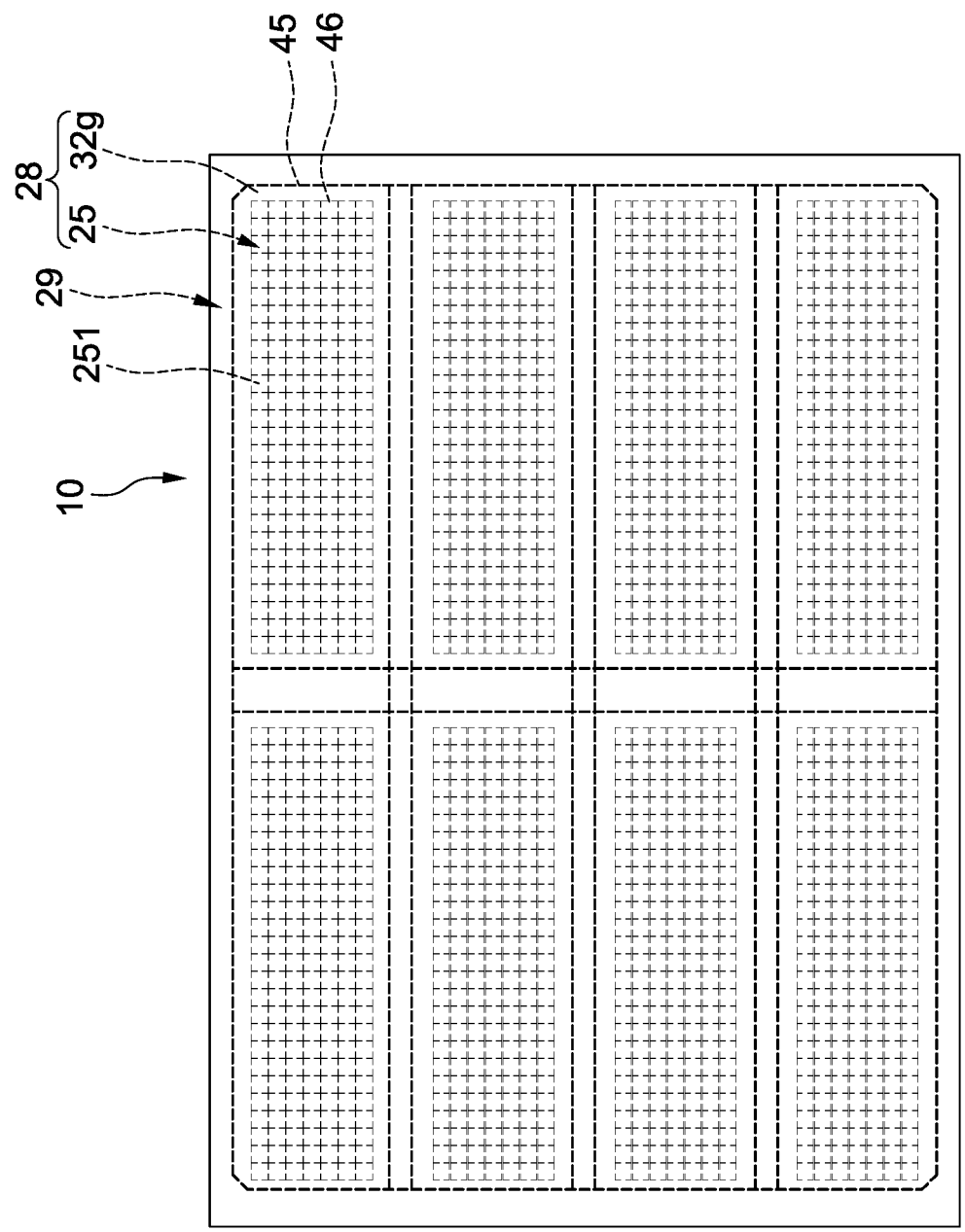
FIG. 4A illustrates one or more stages of an example of a method for manufacturing an assembly structure according to some embodiments of the present disclosure.
Figure 4C:
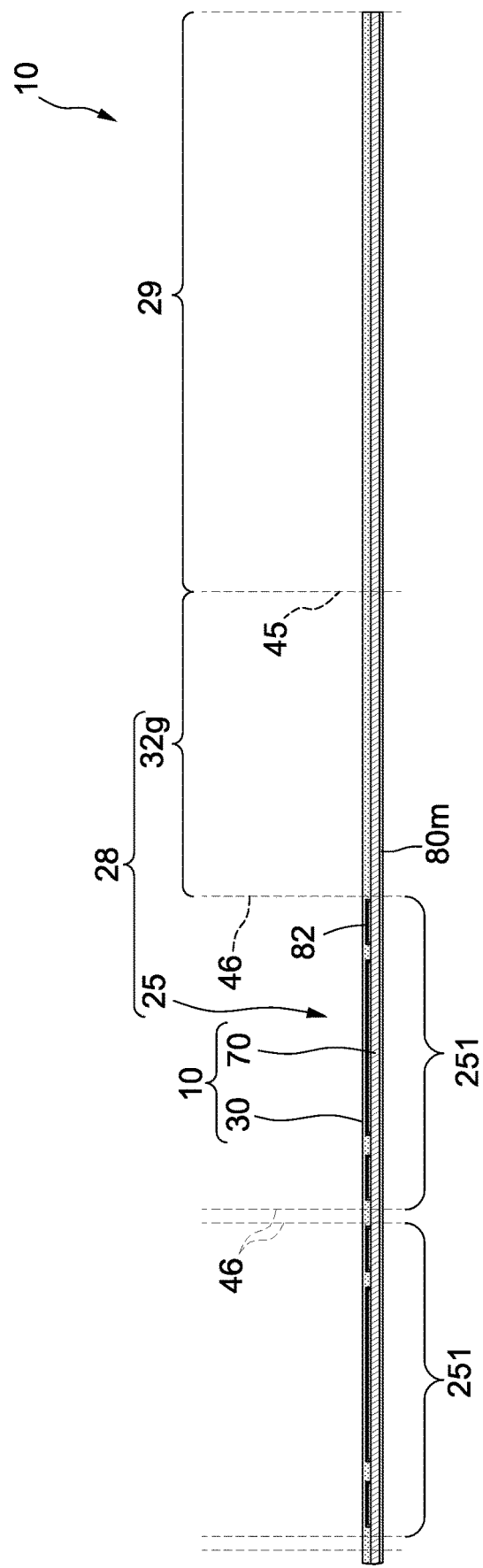
FIG. 4C illustrates one or more stages of an example of a method for manufacturing an assembly structure according to some embodiments of the present disclosure.

Referring to FIGS. 4A, 4B and 4C, a second insulation layer 30 is formed on the top surface of the carrier 70. FIG. 4A illustrates a top view of a substrate 10 according to some embodiments of the present disclosure. FIG. 4B illustrates a partially enlarged view of the substrate 10 of FIG. 4A. FIG. 4C illustrates a cross-sectional view taken along line D-D' in FIG. 4B. As shown in FIG. 4C, the second insulation layer 30 covers the intermediate conductive layer 82 and the top surface of the carrier 70. After the second insulation layer 30 is formed, the second insulation layer 30 and carrier 70 together form the substrate 10. The substrate 10 includes the carrier 70 and the second insulation layer 30. As shown in FIGS. 4A and 4B, the substrate 10 includes at least one active region 28 and a side rail 29. The side rail 29 surrounds the active region 28. In some embodiments, the active region 28 and the side rail 29 are defined by at least one predetermined separation line 45. The substrate 10 further defines a chip attach area 25 and a gap 32g within the active region 28. The chip attach area 25 may include a plurality of unit areas 251 arranged in an array. Each of the unit areas 251 may be used for an electronic component 20 (FIG. 1) to be disposed on. The chip attach area 25 and the unit areas 251 are defined by a plurality of inner sawing line 46.

Figure 5A:
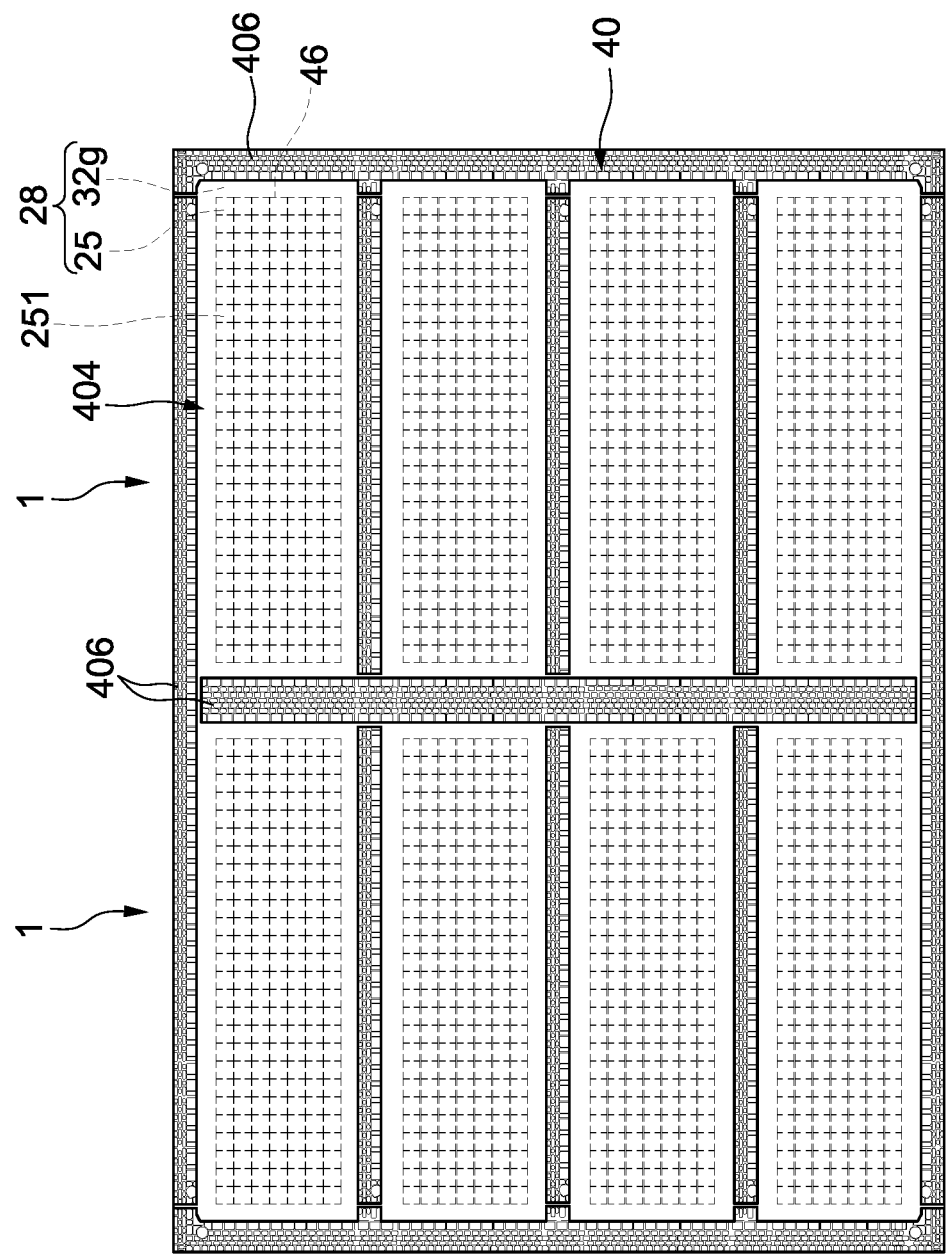
FIG. 5A illustrates one or more stages of an example of a method for manufacturing an assembly structure according to some embodiments of the present disclosure.
Figure 5C:
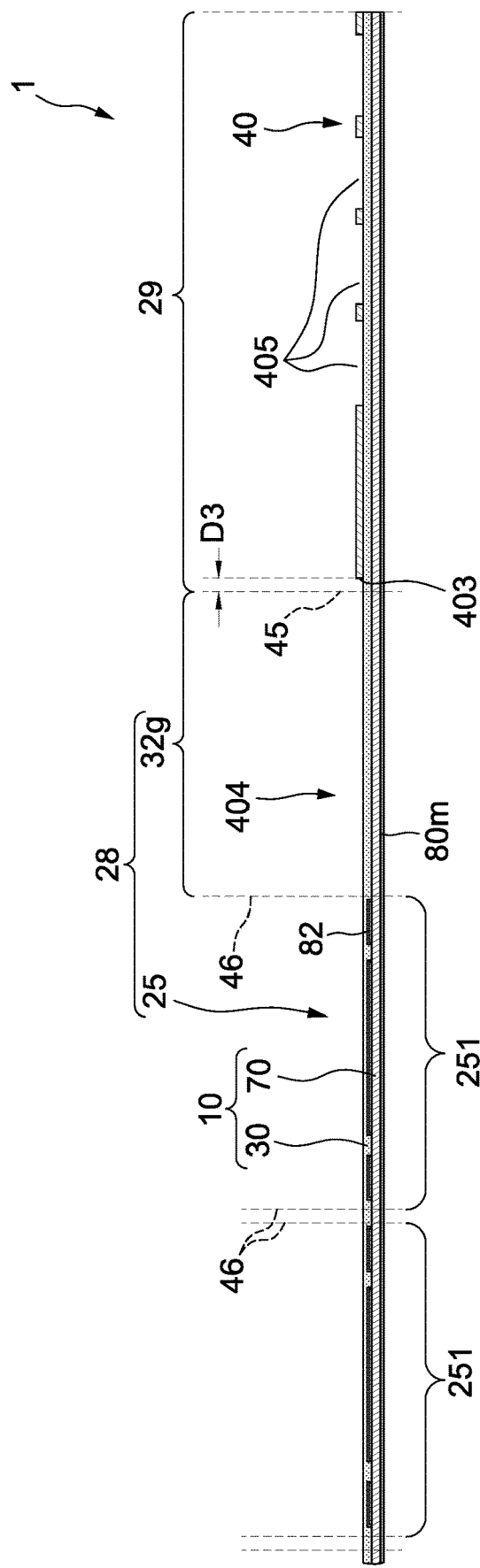
FIG. 5C illustrates one or more stages of an example of a method for manufacturing an assembly structure according to some embodiments of the present disclosure.

Referring to FIGS. 5A, 5B and 5C, an assembly structure 1 is provided as follows. FIG. 5A illustrates a top view of the assembly structure 1 according to some embodiments of the present disclosure. FIG. 5B illustrates a partially enlarged view of the assembly structure 1 of FIG. 5A. FIG. 5C illustrates a cross-sectional view taken along line E-E' in FIG. 5B. A frame structure 40 is disposed on and contacts the second insulation layer 30 of the substrate 10. The frame structure 40 is disposed on the side rail 29 of the substrate 10 so as to form the assembly structure 1. The frame structure 40 and the assembly structure 1 may be similar to the frame structure 40 and the assembly structure 1 of FIGS. 2A to 2D, respectively. The frame structure 40 may include a stainless steel frame. The assembly structure 1 includes the substrate 10 and the frame structure 40 on a top surface of the substrate 10. The side rail 29 is covered by the frame structure 40. The frame structure 40 is disposed only on the side rail 29. That is, the frame structure 40 does not extend into the active region 28.

Figure 6:
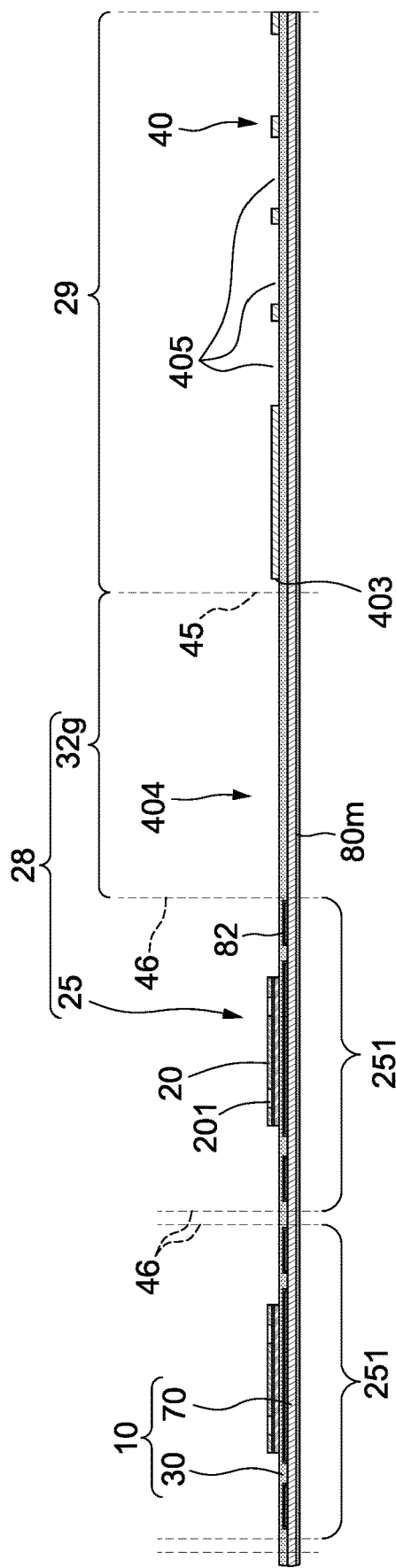
FIG. 6 illustrates one or more stages of an example of a method for manufacturing an assembly structure according to some embodiments of the present disclosure.

Referring to FIG. 6, an electronic component 20 is disposed on the second insulation layer 30. In some embodiment, the electronic component 20 is disposed in the active region 28 of the substrate 10 from a top view. The electronic component 20 includes a conductive pad 201. In some embodiment, an electronic component 20 is disposed in the chip attach area 25 of the substrate 10 from a top view. The electronic component 20 is attached to each of the unit areas 251 of the chip attach area 25.

Figure 7:
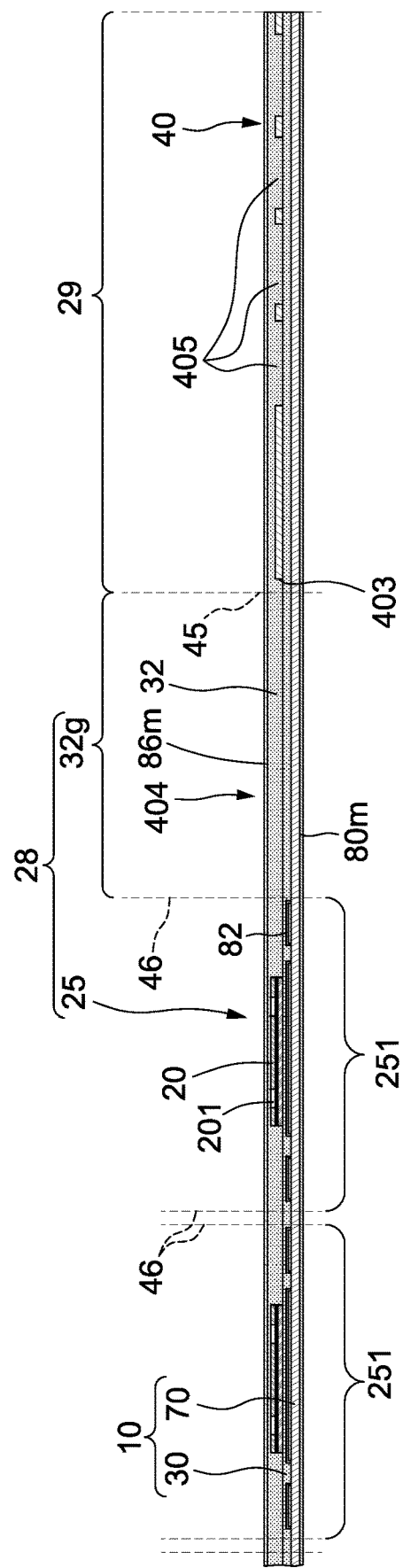
FIG. 7 illustrates one or more stages of an example of a method for manufacturing an assembly structure according to some embodiments of the present disclosure.

Referring to FIG. 7, a first insulation layer 32 is formed on the substrate 10 to cover the electronic component 20 and the frame structure 40. In some embodiment, the first insulation layer 32 covers the whole frame structure 40. A conductive layer 86m is formed on the insulation layer 32. In some embodiments, the conductive material 86m may include, for example, Cu or other suitable conductive material. For example, the conductive layer 86m may be a copper foil, and may be formed by adhering or lamination.

Referring to FIG. 8, an opening 332 is formed to extend through the second insulation layer 30, the first insulation layer 32 and the conductive layer 86m. Further, an opening 331 is formed to extend through the first insulation layer 32 and the conductive layer 86m. The opening 332 exposes a portion of the intermediate conductive layer 82, and the opening 331 exposes a portion (e.g., the conductive pad 201) of the electronic component 20. The opening 331, 332 may be formed by a drilling operation, etching operation or other suitable operations.

Referring to FIG. 9, a conductive material 86m' may be formed on the conductive layer 86m by, for example, plating. The conductive material 86m' is further formed within the openings 332 and 331. In some embodiments, the conductive material 86m' may include, for example, Cu, other metal(s) or alloy(s), or other suitable conductive material.

Referring to FIG. 10, the conductive material 86m' (and the conductive layer 86m) is patterned by, for example, etching operation. Thus, a third redistribution structure 86a, a second conductive layer 86b and an interconnection 86 are formed. In some embodiments, the third redistribution structure 86a is disposed in the opening 331, and is used for electrically connecting the conductive pad 201 of the electronic component 20 and the second conductive layer 86b. The third redistribution structure 86a may include a conductive layer, and is disposed within the first insulation layer 32. The second conductive layer 86b is disposed on the top surface of the first insulation layer 32. The interconnection 86 is disposed in the opening 332, and is used for electrically connecting the intermediate conductive layer 82 and the second conductive layer 86b.

Referring to FIG. 11, a second dielectric layer 72 is formed on the third redistribution structure 86a, the second conductive layer 86b and the first insulation layer 32 so as to form a second redistribution structure 72b. The second redistribution structure 72b includes the second dielectric layer 72 and the second conductive layer 86b. The second conductive layer 86b is disposed within the second dielectric layer 72. Further, the third redistribution structure 86a electrically connects the electronic component 20 and the second redistribution structure 72b. Then, a conductive layer 89m is formed on the second dielectric layer 72. In some embodiments, the conductive material 89m may include, for example, Cu or other suitable conductive material. For example, the conductive layer 89m may be a copper foil, and may be formed by adhering or lamination.

Referring to FIG. 12, an opening 721 is formed to extend through the second dielectric layer 72 and the conductive layer 89m. The opening 721 exposes a portion of the second conductive layer 86b. An opening 722 is formed to extend through the carrier 70 and the conductive layer 80m. The opening 722 exposes a portion of the intermediate conductive layer 82. The opening 721, 7222 may be formed by a drilling operation, etching operation or other suitable operations.

Referring to FIG. 13, a conductive layer 89m' is formed in the opening 721 and on conductive layer 89m by, for example, plating. In addition, a conductive layer 80m' is formed in the opening 722 and on the conductive layer 80m by, for example, plating. In some embodiments, the conductive layer 80m' and 89m' may include, for example, Cu, other metal(s) or alloy(s), or other suitable conductive material.

Referring to FIG. 14, the conductive layer 89m' (and the conductive layer 89m) is patterned by, for example, etching or other suitable operations, so as to form an outer circuit layer 89. The outer circuit layer 89 is disposed on the second dielectric layer 72 of the second redistribution structure 70b. A portion of the outer circuit layer 89 is disposed in the opening 721 to contact the second conductive layer 86b. In addition, the conductive layer 80m' (and the conductive layer 80m) is patterned by, for example, etching or other suitable operations, so as to form a first conductive layer 80. The first conductive layer 80 may be disposed on a bottom surface of the carrier 70. Portions (e.g., via portions) of the first conductive layer 80 may be disposed in the opening 722 to contact the intermediate conductive layer 82. Meanwhile, a first redistribution structure 70a is formed. The first redistribution structure 70a includes the carrier 70 and the first conductive layer 80.

Referring to FIG. 15, a second protection layer 77 is formed or disposed on the second redistribution structure 72b to cover the outer circuit layer 89. The second protection layer 77 may define at least one opening to expose at least one portion of the outer circuit layer 89. In addition, a first protection layer 78 is disposed on the first redistribution structure 70a to cover the first conductive layer 80. The first protection layer 78 may define at least one opening to expose at least one portion of the first conductive layer 80. In some embodiment, the first protection layer 78 and the second protection layer 77 may be solder mask layers. Then, a surface finish layer 90a may be formed or disposed on the exposed portion of the outer circuit layer 89. A surface finish layer 90b may be formed or disposed on the exposed portion of the first conductive layer 80.

Figure 16:
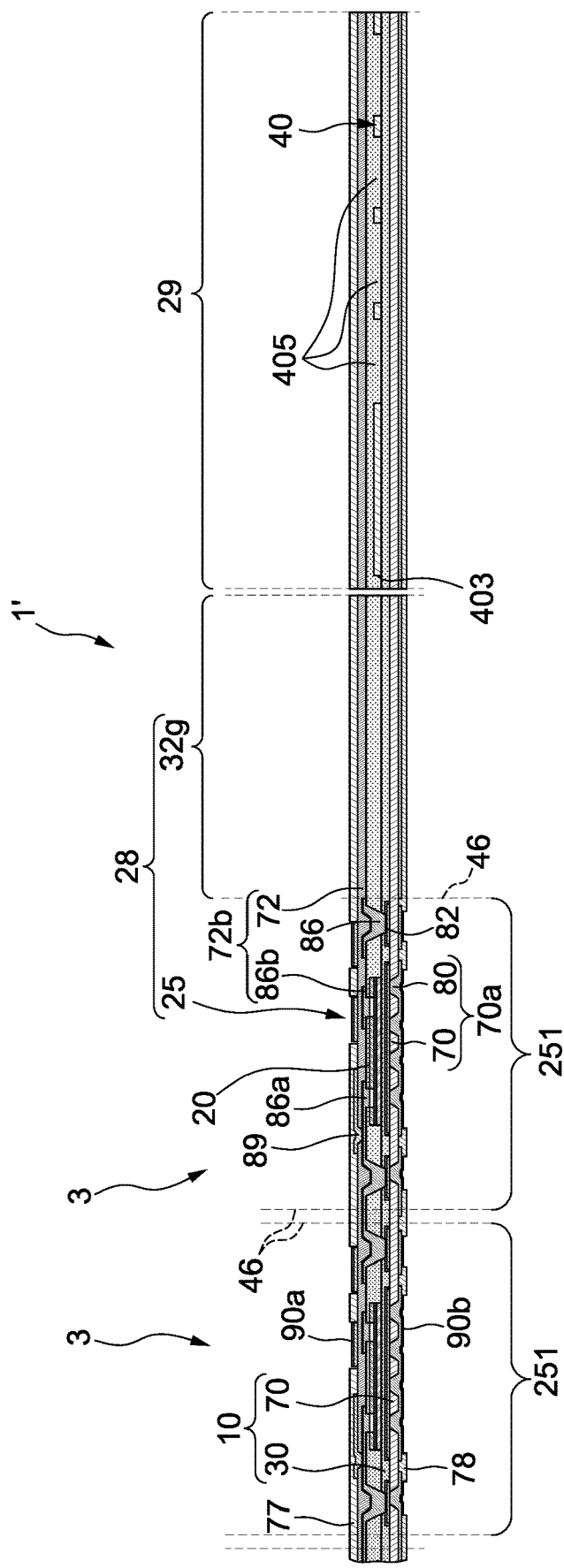
FIG. 16 illustrates one or more stages of an example of a method for manufacturing an assembly structure according to some embodiments of the present disclosure.

Referring to FIG. 16, the frame structure 40 is removed through a sawing operation along the predetermined separation line 45 so as to obtain a plurality of assembly structures 1' as shown in FIGS. 2E and 2F. That is, the substrate 10 is separated along the predetermined separation line 45. The frame structure 40 is removed by separating the substrate 10 with a predetermined distance D3 (FIG. 2C) from an inner edge 403 of the frame structure 40. In some embodiment, removing the frame structure 40 comprises sawing the substrate 10 without sawing the frame structure 40. Thus, the substantially whole frame structure 40 is removed. Alternatively, a small portion the frame structure 40 may be sawed, and a small portion of the frame structure 40 may remain in the assembly structures 1'.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing an assembly structure by using a frame structure on a substrate, comprising:
   providing the substrate defining an active region and a side rail surrounding the active region;
   forming the frame structure on the side rail;
   disposing an electronic component in the active region of the substrate;
   forming a first insulation layer on the substrate to cover the electronic component and the frame structure; and
   removing the frame structure.

2. The method according to claim 1, wherein the frame structure defines a plurality of through holes, wherein the first insulation layer is filled into the through holes.

3. The method according to claim 1, wherein after removing the frame structure, the assembly structure has a first width along a first direction and a second width along a second direction substantially perpendicular to the first direction, and the first width is greater than the second width.

4. The method according to claim 1, wherein the substrate comprises a carrier and a second insulation layer on the carrier, and the frame structure contacts the second insulation layer.

5. The method according to claim 4, wherein the frame structure defines a plurality of through holes, wherein the second insulation layer is filled into the through holes.

6. The method according to claim 4, wherein the substrate further comprises a conductive layer disposed between the carrier and the second insulation layer.

7. The method according to claim 1, wherein the frame structure substantially defines an opening substantially exposing the active region.

8. The method according to claim 1, wherein the frame structure includes a plurality of separated segments disposed on the side rail.

9. The method according to claim 1, wherein the substrate further defines a chip attach area within the active region, wherein the electronic component is attached to the chip attach area, and wherein a gap between a periphery edge of the chip attach area and a periphery edge of the active region is greater than 2 millimeter (mm) and less than 9 mm.

10. The method according to claim 1, wherein the frame structure is removed along a sawing line, and wherein a distance between the at least one sawing line and an inner edge of the frame structure is greater than 0.1 mm.

11. The method according to claim 1, wherein the frame structure includes a stainless steel frame.

12. The method according to claim 1, wherein the active region and the side rail are defined by at least one predetermined separation line, and a predetermined distance is between the at least one predetermined separation line and an inner edge of the frame structure.

13. The method according to claim 12, wherein the predetermined distance is greater than 0.1 millimeter (mm).

14. The method according to claim 1, wherein the substrate further defines a chip attach area within the active region, wherein a predetermined gap is between a periphery edge of the chip attach area and a periphery edge of the active region.

15. The method according to claim 14, wherein the predetermined gap is greater than 2 mm and less than 9 mm.

16. The method according to claim 1, wherein the frame structure substantially defines a window, and a size of the active region is less than a size of the window of the frame structure.

17. A method for manufacturing an assembly structure by using a frame structure on a substrate, comprising:
   providing the substrate defining an active region and a side rail surrounding the active region;
   forming the frame structure on the side rail, wherein the active region and the side rail are defined by at least one predetermined separation line, and a predetermined distance is between the at least one predetermined separation line and an inner edge of the frame structure; and removing the frame structure by separating the substrate along the predetermined separation line.

18. A method for manufacturing an assembly structure by using a frame structure on a substrate, comprising:
providing the substrate;
forming the frame structure on the substrate; and
removing the frame structure by separating the substrate with a predetermined distance from an inner edge of the frame structure.

19. The method according to claim 18, wherein after removing the frame structure, the substrate is in a strip shape.

* * * * *